(12) United States Patent
Bretschneider (10) Patent No.: US 9,721,980 B2
(45) Date of Patent: Aug. 1, 2017

(54) MOS-TRANSISTOR STRUCTURE AS LIGHT SENSOR

(71) Applicant: NXP B.V., Eindhoven (NL)

(72) Inventor: Ernst Bretschneider, Erfurt (DE)

(73) Assignee: NXP B.V., Eindhoven (NL)

( * ) Notice: Subject to any disclaimer, the term of this patent is extended or adjusted under 35 U.S.C. 154(b) by 450 days.

(21) Appl. No.: 14/222,751

(22) Filed: Mar. 24, 2014

(65) Prior Publication Data

US 2014/0312205 A1     Oct. 23, 2014

(30) Foreign Application Priority Data

Apr. 23, 2013   (EP) ..................................... 13164997

(51) Int. Cl.

| | |
|---|---|
| *H01L 27/00* | (2006.01) |
| *H01L 27/144* | (2006.01) |
| *H01L 27/146* | (2006.01) |
| *G01J 1/42* | (2006.01) |
| *G01J 1/46* | (2006.01) |
| *H04N 5/378* | (2011.01) |

(52) U.S. Cl.
CPC .............. *H01L 27/144* (2013.01); *G01J 1/42* (2013.01); *G01J 1/46* (2013.01); *H01L 27/14612* (2013.01); *H01L 27/14681* (2013.01); *H04N 5/378* (2013.01)

(58) Field of Classification Search
USPC ........................... 250/208.1, 214 R, 214 SW; 348/272–283, 294–324, 332, 333.08, 348/335–338; 257/291–294, 414, 257/431–466; 438/57, 59–98, 144
See application file for complete search history.

(56) References Cited

U.S. PATENT DOCUMENTS

| | | | |
|---|---|---|---|
| 5,027,177 A | * | 6/1991 | Vasudev ............. H01L 27/1443 257/131 |
| 6,657,179 B1 | | 12/2003 | Henno |
| 6,784,933 B1 | | 8/2004 | Nakai |

(Continued)

FOREIGN PATENT DOCUMENTS

| | | |
|---|---|---|
| CN | 1855541 A | 1/2006 |
| DE | 199 07 970 A1 | 8/2000 |
| WO | 2007/052870 A1 | 5/2007 |

OTHER PUBLICATIONS

Extended European Search Report for Application No. 13164997.2 (Jan. 24, 2014).

(Continued)

*Primary Examiner* — Kevin Pyo (57) ABSTRACT

Described is an arrangement for registering light, comprising: a MOS-transistor structure having a first source/drain region, a second source/drain region, and a bulk region at least partially between the first source/drain region and the second source/drain region, wherein the bulk region has a doping type different from another doping type of the first and the second source/drain regions, wherein in the bulk region charge carriers are generated in dependence of light impinging on the bulk region, wherein the generated charge carriers control a current flowing from the first source/drain region to the second source/drain region via at least a portion of the bulk region.

18 Claims, 7 Drawing Sheets

(56) References Cited

U.S. PATENT DOCUMENTS

| | | | |
|---|---|---|---|
| 7,005,624 B2* | 2/2006 | Hamilton | A61F 9/061 |
| | | | 250/205 |
| 7,354,816 B2 | 4/2008 | Goldbach et al. | |
| 2006/0108618 A1 | 5/2006 | Ahn et al. | |
| 2006/0128087 A1* | 6/2006 | Bamji | G01S 7/4816 |
| | | | 438/199 |
| 2009/0160991 A1 | 6/2009 | Kim et al. | |
| 2013/0119240 A1* | 5/2013 | Hayashi | H01L 27/1446 |
| | | | 250/208.1 |

OTHER PUBLICATIONS

Chinese Office Action to Chinese Application No. 201410164042.9 dated Jan. 11, 2016.

* cited by examiner

MOS-TRANSISTOR STRUCTURE AS LIGHT SENSOR

CROSS-REFERENCE TO RELATED APPLICATIONS

This application claims the priority under 35 U.S.C. §119 of European patent application no. 13164997.2, filed on Apr. 23, 2013, the contents of which are incorporated by reference herein.

FIELD OF THE INVENTION

The present invention relates to an arrangement for registering light, wherein the arrangement can in particular be arranged in a single chip for example for use in a chip card.

BACKGROUND OF THE INVENTION

US 2006/0108618 A1 discloses a CMOS image sensor having buried channel MOS-transistors, wherein the CMOS image sensor includes a photo-converting device and a source follower transistor. Thereby, the photo-converting device generates a current signal and changes a voltage of a floating node in response to energy of an incident light.

It may be known to form a bipolar transistor in a MOS semiconductor process. Thereby, a p+ active area within an Nwell-region (n-) may form the emitter, the Nwell itself forms the base and the low doped substrate (p-) forms the connector (in the case of a pnp type bipolar transistor). It may also be known to use this kind of bipolar transistor as a photo-transistor in which case the base contact or base terminal is removed so that the Nwell is floating (i.e. has no defined electric potential). Under the influence of light impinging in this region, electrical charges may be generated within the Nwell and a current may flow between the emitter and the collector depending on their voltage difference, the wavelength and the intensity of the impinging light.

However, it has been observed that this photo-transistor has several disadvantages. First of all, the geometry, especially the width of the base may not be well controlled. Further, this photo-transistor may have a low current gain. Furthermore, this kind of photo-transistor has a strong temperature dependency, i.e. the current between the emitter and the collector heavily or strongly depends on the temperature which may hamper the quality of the signal which should ideally be linearly dependent on the light intensity. In particular, due to the high temperature dependency, the linearity of the sensor cannot be ensured. The same disadvantages have been observed for the complementary transistor, i.e. the npn type bipolar transistor configured as a photo-transistor.

There may be a need for an arrangement for registering or sensing light (and in particular providing an output signal being essentially linearly dependent on the light intensity), wherein at least some of the above-mentioned disadvantages are reduced or even overcome. In particular, there may be a need for an arrangement for registering light which provides a reliable light detection which can be manufactured in an integrated manner, such as to serve also as a light sensor within a chip card.

The above need is satisfied by the subject-matter of the independent claim which is directed to an arrangement for registering light. The dependent claims specify particular embodiments of the present invention.

OBJECT AND SUMMARY OF THE INVENTION

According to an embodiment of the present invention it provided an arrangement for registering light, comprising a MOS-transistor structure having a first source/drain region, a second source/drain region, and a bulk region at least partially between the first source/drain region and the second source/drain region, wherein the bulk region has a doping type different from another doping type of the first and the second source/drain regions, wherein in the bulk region charge carriers are generated in dependence of light impinging on the bulk region, wherein the generated charge carriers control a current flowing from the first source/drain region to the second source/drain region via at least a portion of the bulk region.

Registering the light may comprise to receive electromagnetic radiation in the visible or invisible wavelength range, such as in a wavelength range between 100 nm to 1400 nm, or even lower or higher wavelength, wherein the electromagnetic radiation is received or incident or impinging at or in the bulk region of the MOS-transistor structure. Therein, within the bulk region, electronic excitation processes may occur which may result in the release of free electrons from atoms within the bulk region. In particular, the bulk region may comprise silicon atoms and dopant atoms which may either have three (p-type) or five electrons (n-type) on the outer shell. The released electrons and also the thereby generated holes may contribute (as charge carriers) to a current flow from the first source/drain region to the second source/drain region. The doping type may be defined depending on whether the number of electrons on the outer shell is greater or smaller than the number of electrons on the outer shell of silicon which is four electrons.

Each of the source/drain regions, i.e. the first source/drain region and/or the second source/drain region may either be a source region as defined in a conventional MOS-transistor or a drain region as defined in a conventional MOS-transistor. In particular, the first source/drain region may be laterally spaced apart from the second source/drain region and at least a portion of the bulk region may be arranged between the first source/drain region and the second source/drain region. Further, the first source/drain region and also the second source/drain region may each comprise a respective source/drain terminal, in order to enable to apply a defined potential at the first source/drain region and the second source/drain region, respectively.

In the MOS-transistor structure, a gate may be missing or may not be required or at least the gate may not be connected to any defined voltage, or may be floating. For the MOS-transistor structure a conventional MOS-transistor may be used in such a conventional MOS-transistor the gate and the bulk region may act as a capacitor and a voltage between the gate and the bulk region may generate an electric field partially within the bulk region in a channel region, wherein this electric field may in a conventional MOS-transistor control generation or at least concentration of charge carriers within this channel region and may thereby control a current flow between the first source/drain region and the second source/drain region. In a conventional MOS-transistor, the gate and the bulk region are isolated by a thin oxide layer (gate oxide) and act as a capacitor. If a definite electrical potential is supplied between the gate and the bulk region the generated electric field partially within the bulk region forms a so called channel below the gate oxide. An electrical current flows in horizontal direction, if a second electrical potential between the first source/drain region and the second source/drain region is supplied. The amount of current will be controlled by the gate potential.

According to an embodiment of the present invention, the MOS-transistor structure may also considered as a lateral bipolar structure: the source/drain region forms the emitter (E) respectively the collector (C), the bulk region creates/forms the base (B). The GATE (of the MOS-transistor structure) isn't connected, it has no more electrical function, it may define the geometrical distance between emitter and collector (i.e first source/drain region and second source/drain region). That means that the base width of the bipolar transistor may be very well controlled now by the geometry of the gate. But this "derived" bipolar transistor structure may different drawbacks, e.g. the current gain may be very low, a temperature dependent leakage current may flow between first source/drain region and the second source/drain region in the off-state and may not well controlled, if not further measures are applied according to embodiments of the present invention.

The first source/drain region (which may have a function as a first emitter/collector region in a bipolar transistor) and the second source/drain region (which may have a function as a second emitter/collector region in a bipolar transistor) may for example both be doped with atoms having three electrons on the outer shell or five electrons on the outer shell. The bulkregion (which may have a function as a base in a bipolar transistor) may be doped with atoms having five atoms on the outer shell, when the source/drain regions are doped with atoms having three electrons on the outer shell. In turn, the bulk region may be doped with atoms having three electrons on the outer shell, when the source/drain regions are doped with atoms having five electrons on the outer shell. Thereby, in particular, the MOS-transistor structure may resemble (or have a function of) an npn-type MOS-transistor or a pnp-type MOS-transistor. However, the gate may not be required and may be missing or at least may not be connected to a defined potential. According to a simple embodiment, a conventional MOS-transistor may be utilized as the MOS-transistor structure, wherein the gate is not connected to any defined potential but is freely floating.

The gate may at least be defining a geometrical distance between the first source/drain region and the second source/drain region which may act in a function resembling a function of an emitter and a collector of a bipolar transistor. According to this embodiment of the present invention, the MOS-transistor structure may resemble a bipolar structure and may be used as a light sensitive element which is for example applicable within light sensors. The arrangement may comprise further elements to improve or overcome the leakage problem and solve the problem of the floating base (Nwell).

According to an embodiment of the present invention, the charge carriers are generated within the bulk region, even if no voltage is applied between the bulk region and a gate (if present) of the MOS-transistor structure which is separated by an isolation layer from the bulk region.

According to an embodiment of the present invention, the charge carriers are generated within the bulk region, even if no voltage is applied between the first source/drain region and the second source/drain region.

Thereby, the arrangement for registering light may not rely on (or require) an electric field controlling the current flow between the respective source/drain regions but may, like a bipolar transistor, rely on charge carriers being generated (or concentrated) within the bulk region due to processes which are different from a generated electric field across a gate and the bulk region. Thereby, advantageous properties of a bipolar transistor may be utilized within the arrangement for registering light to improve the detection of light.

According to an embodiment of the present invention, a high resistance connection, in particular having a resistance between 1 MΩ ($10^6$Ω) and 100 GΩ ($10^{11}$Ω), is established between the bulk region and the first source/drain region.

By providing the high resistance connection between the bulk region and the first source/drain region, the bulk region may not be free floating any more, but may have a defined potential without allowing a high current flow from or to the bulk region. Thereby, a leakage problem may be reduced, thereby improving the sensing of the incident light.

According to an embodiment of the present invention, if the bipolar transistor structure is used as a photo-transistor the base has to be unconnected (floating) but this worsens the problem of the leakage current. This undesired leakage problem can be solved by a further MOS-transistor, for which a conventional MOS-transistor may be used. This further MOS-transistor structure having a further first source/drain region, a further second source/drain region, a further bulk region, and a further gate, wherein the further first source/drain region, the further gate and the further bulk region are electrically connected with each other and forms a switched off MOS-transistor, wherein the further second source/drain region of the further MOS-transistor structure is electrically connected to the bulk region (floating base) of the MOS-transistor structure (in particular performing a function of a bipolar transistor).

The further MOS-transistor structure may be of the same type as the MOS-transistor structure but may have a (different or same) size which maybe adjusted such that the further MOS-transistor structure may advantageously act as a high resistance connection, in order to set the bulk region at a defined electric potential and also to allow a low current flow to bypass the leakage current flowing in the MOS-transistor structure.

In particular, the undesired leakage problem of the MOS-transistor structure may be solved by the further MOS-transistor structure of the same type like the MOS-transistor structure. Further, if the drain (second source/drain region) of this further MOS-transistor structure is connected to the base (i.e. bulk region) (floating well) of the MOS-transistor structure (receiving the light and acting as primary light sensing portion) and the source (the first source/drain region) of the further MOS-transistor structure is connected to the emitter (or first source/drain region) of the MOS-transistor structure and if this further MOS-transistor structure is switched off (the gate is shortened to its source), the high resistive connection of the floating well (i.e. the bulk region of the MOS-transistor structure) may be well established. Thereby, the resistance of this high resistance path may be defined by the geometry of the further MOS-transistor structure and the leakage current, but also by the temperature. Thereby, the further MOS-transistor may be easily adapted by adapting its geometry to achieve a desired behaviour.

Since the MOS-transistor structure being operated as a bipolar photo-transistor and the further MOS-transistor structure (providing the high resistance connection) may be of the same type, they may show a same (or at least similar) temperature dependency of their leakage current. Thereby, it may be possible to control the leakage current of the MOS-transistor (in particular acting as bipolar transistor) structure (acting as a light detecting element) by adapting the leakage current of the further MOS-transistor structure.

According to an embodiment of the present invention, the further bulk region has the doping type and the further first and the further second source/drain regions have the other doping type. Thereby, the MOS-transistor structure and the further MOS-transistor structure may be of a same type and have therefore similar properties, in particular regarding their temperature dependency. Thereby, the leakage current problem may be effectively reduced or even eliminated.

According to an embodiment of the present invention, the MOS-transistor structure and the further MOS-transistor structure are of a same type and have essentially a same leakage current characteristics, the leakage current characteristics in particular defining a dependency of the leakage current on the temperature, the leakage current flowing from the respective first source/drain region to the respective second source/drain region.

In particular, the leakage current of the MOS-transistor structure as well as of the further MOS-transistor structure may increase with increasing temperature. Thereby, the increase may have essentially a same functional dependency on the temperature for the two MOS-transistor structures. By using the further MOS-transistor structure having its further second source/drain region electrically connected to the bulk region of the MOS-transistor structure, a high resistive coupling of the bulk region/base of the MOS-transistor structure acting as a photo-transistor may be established to a fixed voltage level at the further second source/drain region of the further MOS-transistor structure. Thereby, the influence of cross-talk on the bulk region (base) may be reduced, too.

According to an embodiment of the present invention, the MOS-transistor structure and the further MOS-transistor structure are arranged to have substantially a same temperature. When the MOS-transistor structure and the further MOS-transistor structure essentially have a same temperature, also their respective leakage currents may be of the same size or may be at least essentially (in particular linearly) related to each other. Thereby, when the leakage current of the MOS-transistor structure increases, also the leakage current of the further MOS-transistor structure increases in a same extent (or an extent which is related to the increase of the leakage current in the MOS-transistor structure) and may effectively reduce the leakage current in the MOS-transistor structure. Thereby, the detection of light may be improved regarding its accuracy.

According to an embodiment of the present invention, a leakage current flowing from the first source/drain region to the second source/drain region is reduced by reducing charge carriers within the bulk region by current flow of the charge carriers from the bulk region to the further first source/drain region via the further second source/drain region.

For example, charge carriers which are spontaneously generated within the bulk region of the MOS-transistor structure (e.g. by cosmic rays, by thermal energy and/or other disturbing influences) may cause (at least a portion of) the leakage current within the MOS-transistor structure. However, these charge carriers which are generated irrespective of the (intensity and/or colour of) incident light may effectively be removed from the bulk region by the high resistance connection to the second source or the further second source/drain region of the further MOS-transistor structure. Thereby, the accuracy of an output signal of the arrangement being linearly dependent on the light intensity may be improved.

According to an embodiment of the present invention, the arrangement further comprises an output terminal to which the second source/drain region is connected, the output terminal providing an output current based on a characteristic, in particular intensity, of the light impinging on the bulk region, wherein the first source/drain region and the further first source/drain region are electrically connected to a reference potential.

The output current may in particular be proportional to an intensity of the impinging light. Alternatively or additionally, the output current may depend on a wavelength of the impinging light. When the first source/drain region and the further first source/drain region are electrically connected to the reference potential, also the bulk region of the MOS-transistor structure may be held at a defined electric potential via its connection via the high resistance path to the reference potential. Thereby, floating of the bulk region may be avoided.

According to an embodiment of the present invention, the arrangement further comprises a resistor connected between the output terminal and a ground potential (or any other reference potential). The output current may flow from the output terminal through the resistor to a ground potential and may generate a voltage drop across the resistor which voltage drop may be then present between the output terminal and the ground potential. Thereby, the voltage drop may represent an output voltage which may in particular be linearly dependent on the intensity of the incident light. Thereby, a simple light sensor may be provided.

According to an embodiment of the present invention, the arrangement further comprises a capacitor connected between the output terminal and a ground potential. The output current may charge the capacitor over time depending on the magnitude of the output current and the capacity of the capacitor. Thereby, over time an increasing output voltage may be measured between the output terminal and the ground potential.

According to an embodiment of the present invention, the arrangement further comprises a comparator having a first input terminal connected to the output terminal and a second input terminal connected to a reference comparator potential.

The comparator may in particular be an operational amplifier having a first input terminal, a second input terminal and an output terminal. The first input terminal may in particular be a non-inverting input terminal and the second input terminal may be a inverting input terminal. An output signal at the output terminal of the comparator may depend on the difference of the potentials applied at the first input terminal and the second input terminal of the comparator. When the potential applied at the first input terminal is larger than the potential applied at the second input terminal, the voltage at the output terminal of the comparator may indicate a difference between the input voltages multiplied by an amplification factor. In particular, at the second input terminal of the comparator, a suitable potential may be applied and then the arrangement can be used to determine whether after a particular time period of charging the capacitor, the voltage across the capacitor is higher or lower than the potential applied at the second input terminal of the comparator. By appropriately selecting or adjusting the capacity of the capacitor and/or the potential applied at the second input terminal, the output voltage at the output terminal of the comparator may reflect the intensity of the light incident on the bulk region of the MOS-transistor structure.

According to an embodiment of the present invention, the arrangement further comprises a capacitor discharge path connected between the output terminal and the ground potential and a controllable switch within the capacitor discharge path, the controllable switch being alternatingly switched on and off.

In particular, switching on and off the controllable switch may be achieved by a (periodic) clock signal. Thereby, the capacitor may be alternatingly charged and discharged, wherein during charging the capacitor, the voltage across the capacitor may be compared to a potential applied at the second input terminal of the comparator. Thereby, during charging the capacitor, the intensity of the incident light may be sensed and reflected as the output signal of the comparator. Thereafter the capacitor may be discharged. Charging and discharging may then alternatingly occur, allowing to measure the light characteristic during the respective charging time interval of each clock cycle.

According to an embodiment of the present invention, the arrangement further comprises a further capacitor connected between the output terminal and the ground potential, a further comparator having a further first input terminal connected to the output terminal and a further second input terminal connected to the reference comparator potential, a further capacitor discharge path connected between the output terminal and the ground potential, a further controllable switch within the further capacitor discharge path, the further controllable switch being alternatingly switched off and on, and a logical OR-element (or NOR-element) connected to an output terminal of the comparator and a further output terminal of the further comparator, wherein the arrangement is adapted to charge the capacitor via the output terminal when the further capacitor is discharged via the further capacitor discharge path, wherein the arrangement is adapted to charge the further capacitor via the output terminal when the capacitor is discharged via the capacitor discharge path.

By this provision, the capacitor may be charged while the further capacitor is discharged and in turn the further capacitor may be charged while the capacitor may be discharged. During charging of either the capacitor or the further capacitor, the respective voltage across the respective capacitor is compared to a potential applied to the second input terminal of the comparator or the further comparator. Thereby, measuring the intensity of the light incident on the bulk region is achievable in a continuous manner.

An output terminal of the logical OR-element (or a NOR-element) may provide an indication of the characteristics of the incident light, in particular its intensity or its wavelength.

The sensitivity of the entire arrangement may be adjusted by selecting or adjusting the capacities of the capacitor and the further capacitor and further by the potential applied at the second input terminals of the comparator and the further comparator and also the frequency of the alternatingly switching on and off, i.e. a clock rate.

According to an embodiment of the present invention, the arrangement is embodied as an electronic chip, i.e. integrated in a single chip, in particular a chip card. In particular, detection of light may provide a security feature of the chip card. In particular, detection of light in the chip card may indicate that an unauthorized access to the data within the chip card is performed by a potential attacker. In particular, under normal conditions, the chip within the chip card may be protected from receiving light by a suitable enclosure or casing which may be not transparent for light. When a potential attacker removes the casing, light may incident on the chip and may be sensed by the arrangement for registering light. Once the light is registered, data on the chip card may be deleted or in another manner protected from being accessed by the potential attacker.

Embodiments of the present invention are now described with reference to the accompanying drawing. The invention is not restricted to the described or illustrated embodiments.

BRIEF DESCRIPTION OF THE DRAWINGS

It should be noted that identical or similar elements in structure and/or function in different figures are labelled with the same reference signs differing only in the first digit.

DESCRIPTION OF EMBODIMENTS

Figure 1:
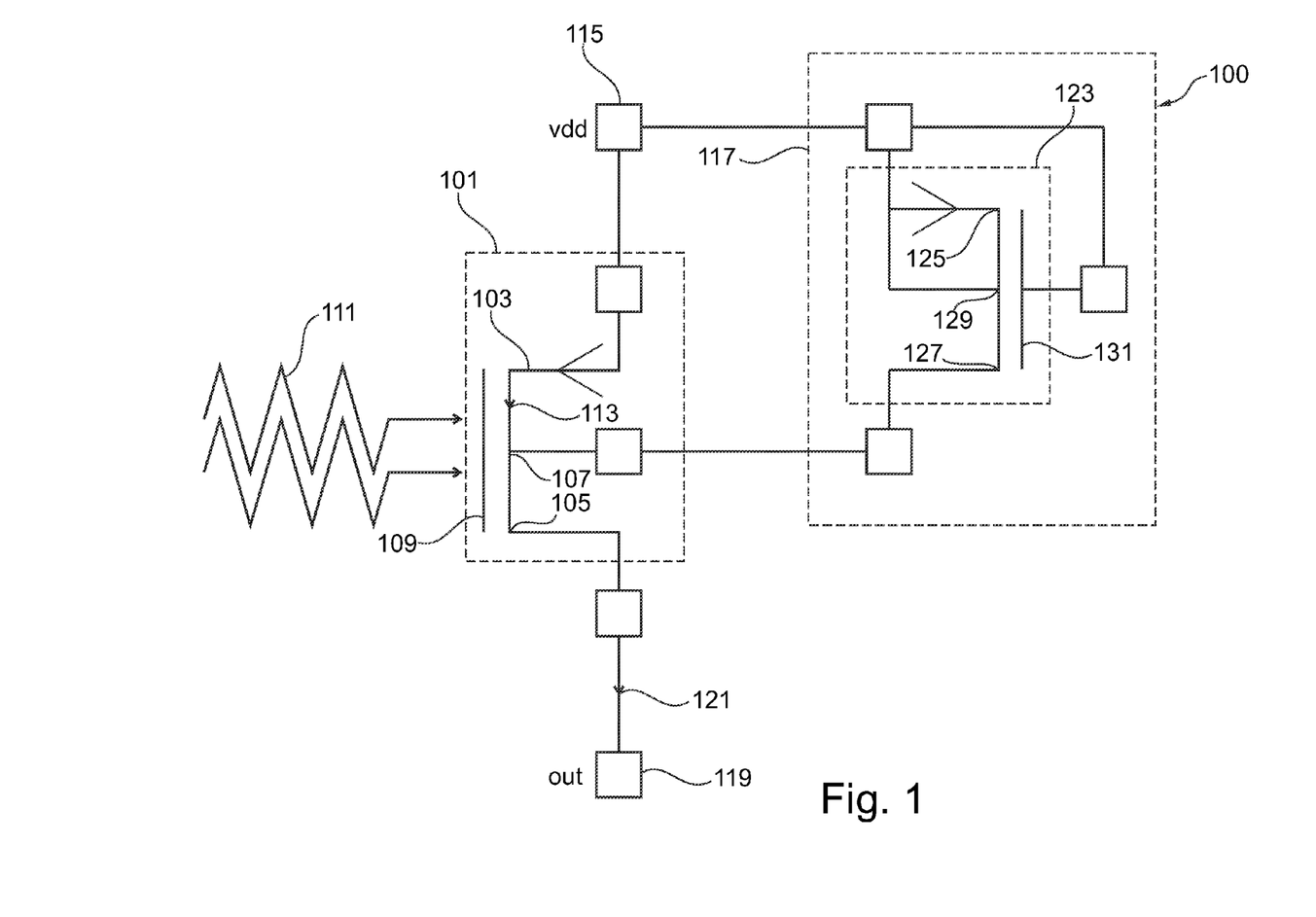
FIG. 1 schematically illustrates an arrangement for registering light according to an embodiment of the present invention.

FIG. 1 schematically illustrates an arrangement 100 for registering light according to an embodiment of the present invention. The arrangement 100 comprises a MOS-transistor structure 101 having a first source/drain region 103, a second source/drain region 105, a bulk region 107, and a gate 109 which may however be missing in other embodiments. In the arrangement 100, upon illumination with light 111, charge carriers are generated within the bulk region 107 and control a current 113 flowing from the first source/drain region 103 to the second source/drain region 105.

The first source/drain region 103 is connected to a reference potential vdd also labelled with reference sign 115. Further, the bulk region 107 of the MOS-transistor structure 101 is connected to the reference potential 115 via a high resistance connection 117, thereby also connecting the bulk region 107 to the first source/drain region 103. By the high resistance connection 117 between the bulk region 107 and the reference potential 115, the bulk region 107 is held at a defined potential which may reduce the influence of crosstalk on the bulk region 107 (acting as or referred to as a base). The arrangement 100 further comprises an output terminal 119 at which an output current 121 may be received, wherein the output current 121 may in particular be proportional to an intensity of the light 111 impinging onto the bulk region 107.

In the illustrated arrangement 100, the high resistance connection 117 is embodied using a further MOS-transistor structure 123 which is of a same type as the MOS-transistor structure 101. In particular, the further MOS-transistor structure 123 comprises a further first source/drain region 125, a further second source/drain region 127, a further bulk region 129 and a further gate 131, wherein the further first source/drain region 125, the further gate 131 and the further bulk region 129 are electrically connected with each other. Further, the further second source/drain region 127 of the further MOS-transistor structure 123 is electrically connected to the bulk region 107 of the MOS-transistor structure.

Figure 2A:
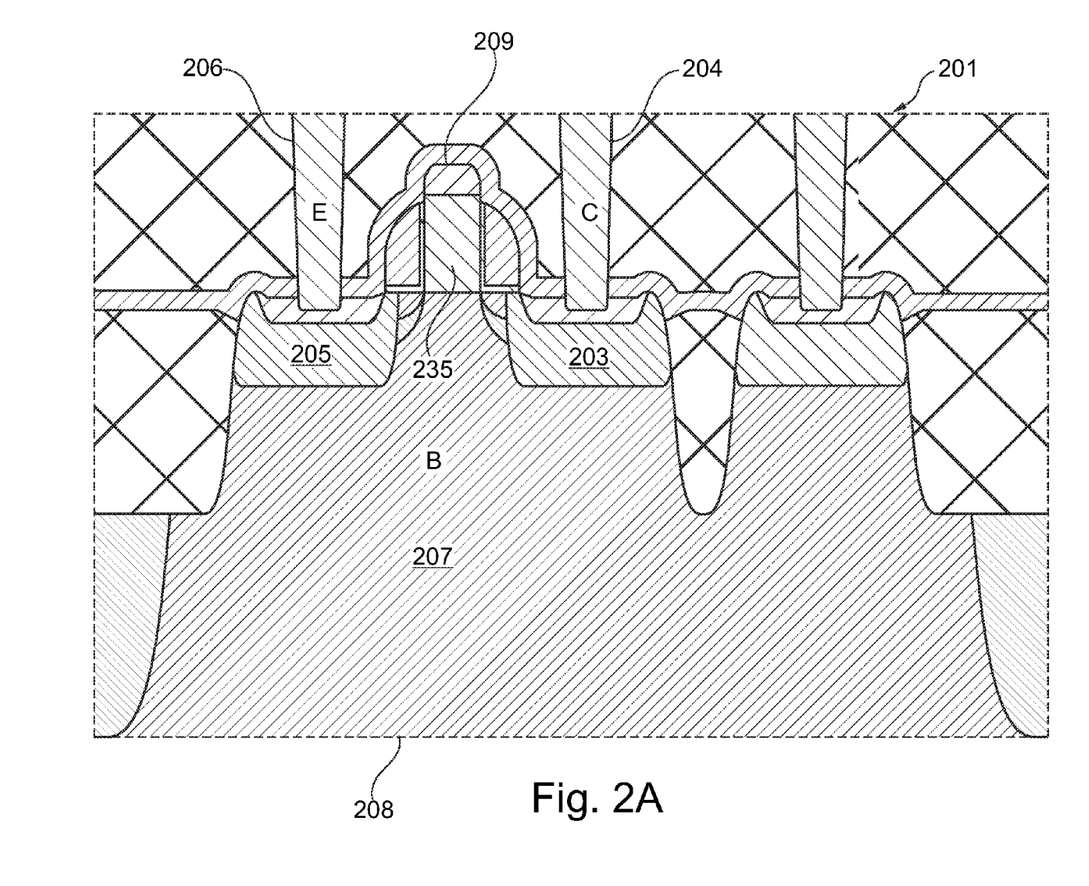
FIG. 2A schematically illustrates a MOS-transistor structure used in an arrangement for registering light according to an embodiment of the present invention.

FIG. 2A schematically illustrates a cross-sectional view of a MOS-transistor structure 201 which may for example be used as a MOS-transistor structure 101 in FIG. 1 or as a further MOS-transistor structure 123 in FIG. 1.

The MOS-transistor structure 201 comprises four connection points, a source terminal 204 (also labelled as C for collector) coupled to a source region 203, a drain terminal 206 (also labelled as E, as emitter) coupled to a drain region 205, a gate terminal 209 and a bulk region 207 (also labelled as B). The distance between the source region (also referred to as the first source/drain region) 203 and the drain region 205 (also referred to as the second source/drain region) may be called a channel and its length may be defined at least approximately by the width of the gate 209. An isolation layer 235 is formed between the gate 209 and the bulk region 207. In particular, the bulk region 207 (the back side of the transistor) is formed by a low doped well. Depending on the transistor type, it can be a p-doped (Pwell) or an n-doped (Nwell) well.

The MOS-structure 201 may also be considered as a lateral bipolar structure, wherein the source and drain are renamed to emitter (E) 205 and collector (C) 203 and wherein the bulk region 207 forms the base (B) of the bipolar transistor. According to an embodiment of the present invention, the gate 209 of the MOS-transistor structure 201 may not be connected to any defined potential when used as the MOS-transistor structure 101 in the arrangement 100 illustrated in FIG. 1. However, the gate may define the geometrical distance between emitter and collector 205, 203 that means it defines the width of the base. The first source/drain region 203 (collector) is connected to a respective collector terminal 204 and the second source/drain region 205 is connected to a respective emitter terminal 206 for external electrical connections. Furthermore, also the bulk region 207 is connected to a respective bulk terminal 208 for electrical connection. The first source/drain region 203 and the second source/drain region 205 may be both have a p-type doping and the bulk region may have an n-type doping or vice versa.

Figure 2B:
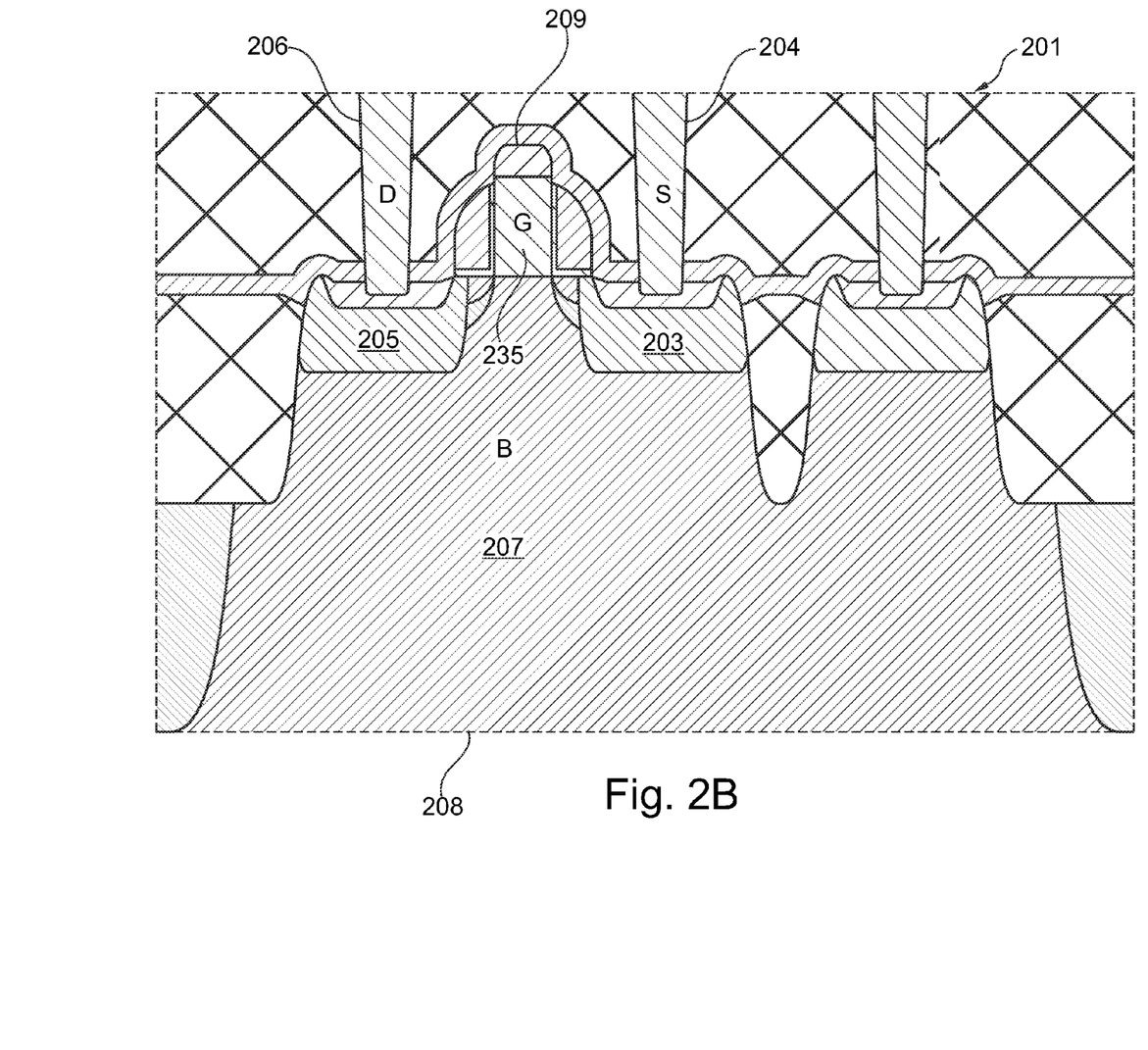
FIG. 2B schematically illustrates a cross section of a conventional MOS transistor that can be used as the MOS-transistor structure of FIG. 2A.

FIG. 2B schematically illustrates a cross-sectional view of a conventional MOS-transistor 201 which may for example be used as a MOS-transistor structure 101 of FIG. 1 or as a further MOS-transistor structure 123 in FIG. 1. In a conventional MOS-transistor 201 of FIG. 2B, the gate (G) and the bulk region (B) are isolated by a thin oxide layer (gate oxide) and act as a capacitor. If a definite electrical potential is supplied between the gate G and the bulk region B the generated electric field partially within the bulk region forms a so called channel below the gate oxide. An electric current flows in horizontal direction from the source (S) to the drain (D), if a second electrical potential between the first source/drain region and the second source/drain region is supplied. The amount of current will be controlled by the gate potential.

Figure 3:
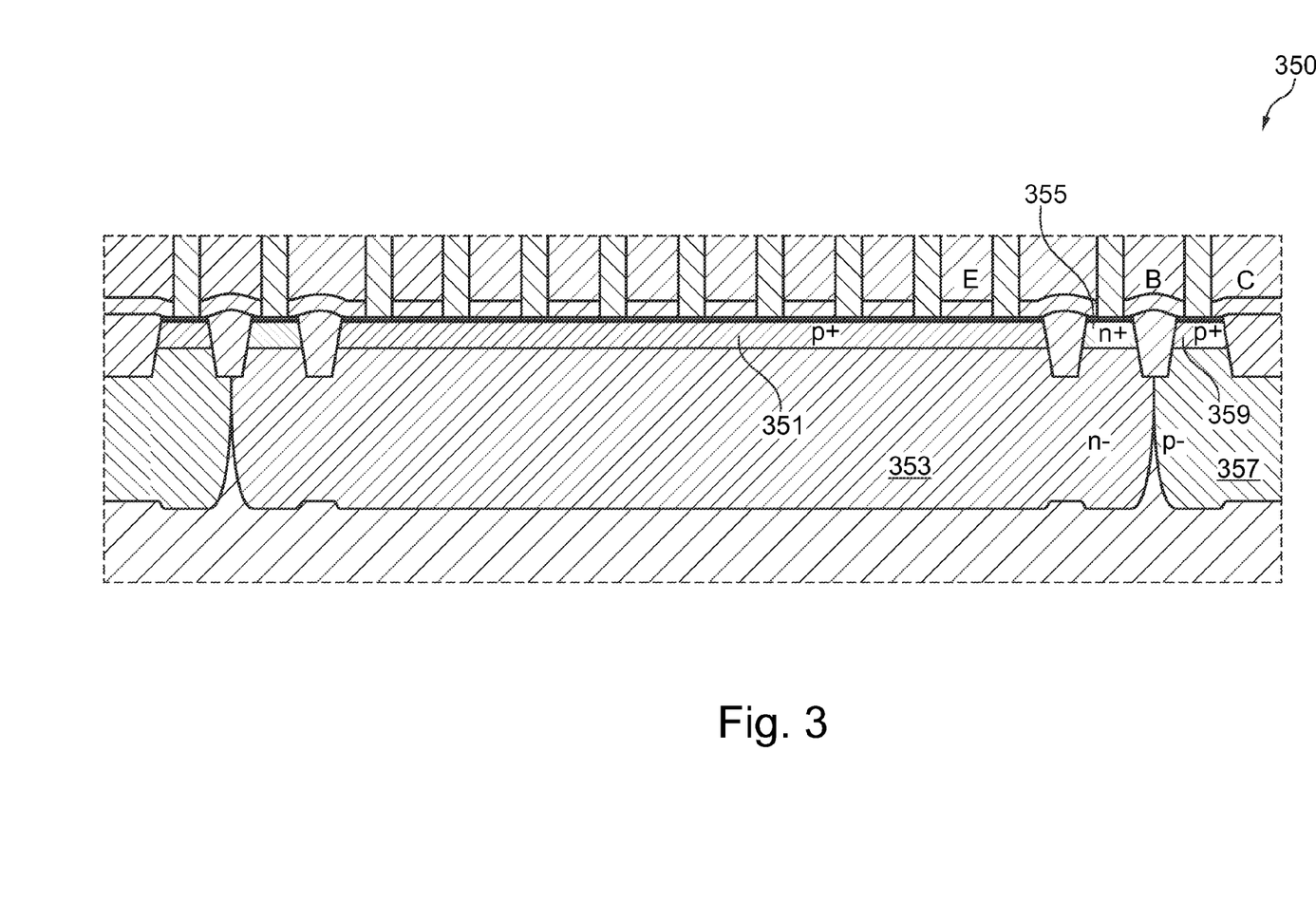
FIG. 3 illustrates schematically a typical bipolar transistor within a MOS process.

FIG. 3 schematically illustrates a vertical bipolar transistor 350, in order to explain a function of the MOS-transistor structure 201 illustrated in FIG. 2. The bipolar transistor 350 illustrated in FIG. 3 has a p+ active area 351 within the Nwell-region (n-) 353, wherein the p+ active area 351 forms the emitter region (having an emitter terminal labelled as E) of the bipolar transistor, the Nwell 353 itself forms the base 355 (having a terminal labelled as B) and the low doped substrate (p-) 357 forms the collector 359 (having a collector terminal labelled as C). When using this bipolar structure 350 as a photo-transistor, the base terminal B is removed so that the Nwell 353, 355 is floating, having no defined potential. Under the influence of light, electrical charges may be generated within the Nwell 353, 355 and a current may flow between the emitter 351 and the collector 359, 357 depending on their voltage difference, the wavelength and the intensity of the light.

According to embodiments of the present invention, a MOS-transistor structure, such as is illustrated in FIG. 2 is operated resembling an operation of a bipolar transistor. However, several disadvantages of the bipolar transistor 350 are reduced or even avoided in that for example the base width may more accurately be controlled and a low current gain and the high temperature dependency of the bipolar transistor may be improved.

Figure 4:
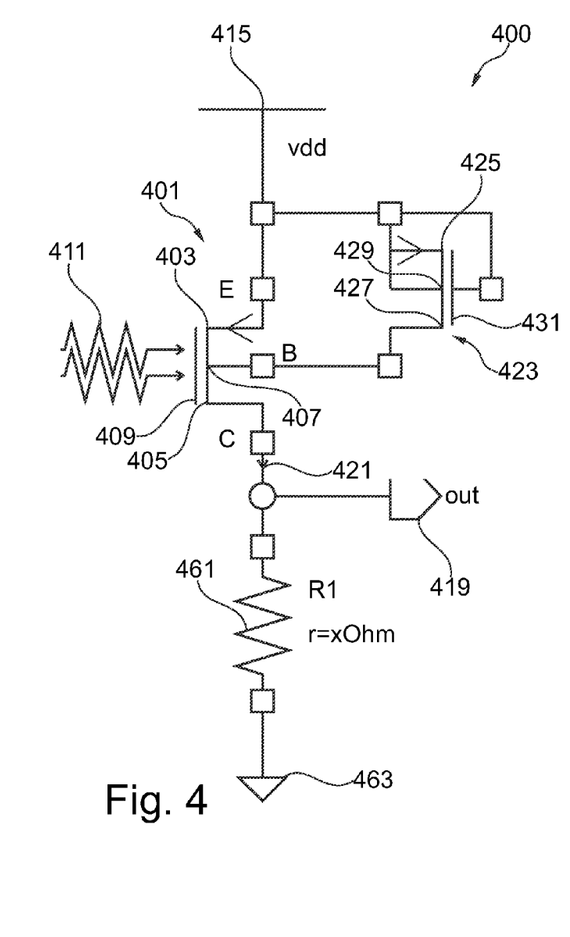
FIG. 4 illustrates an arrangement for registering light according to an embodiment of the present invention.

FIG. 4 schematically illustrates another arrangement 400 for registering light according to another embodiment of the present invention. The arrangement 400 comprises the arrangement 100 illustrated in FIG. 1 and additionally a resistor 461 which is connected between the output terminal 419 and a ground potential 463. The output current 421 flowing through the resistor 461 to the ground potential 463 may generate a voltage drop across the resistor 461 which may be acquired at the output terminal 419. Thereby, the output voltage at the output terminal 419 may depend on the light intensity of the light 411 impinging on the bulk region 407 of the MOS-transistor structure 401.

Figure 5:
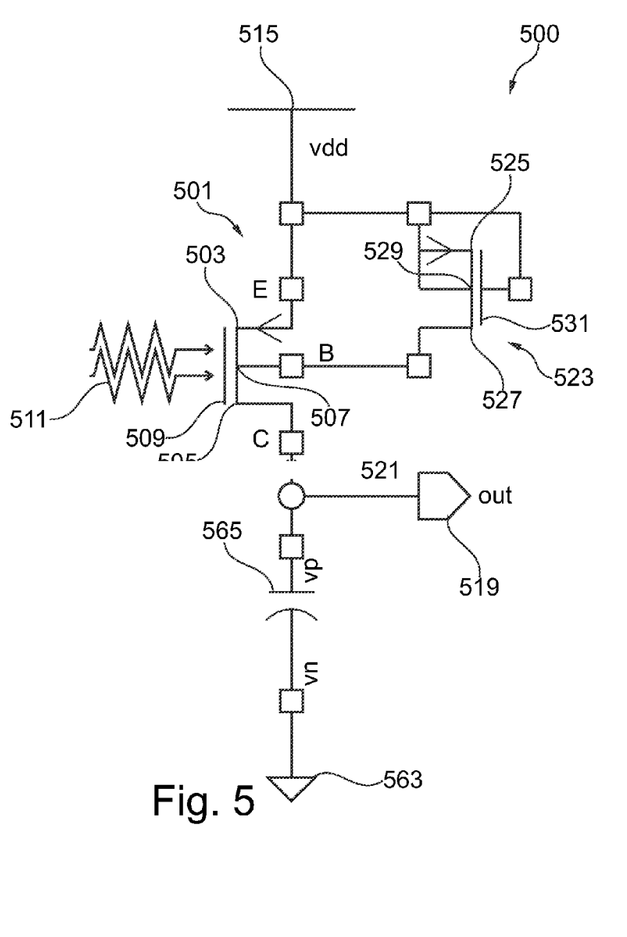
FIG. 5 illustrates an arrangement for registering light according to an embodiment of the present invention.

FIG. 5 illustrates another arrangement 500 for registering light according to a still further embodiment of the present invention. The arrangement 500 comprises the arrangement 100 illustrated in FIG. 1 but instead of the resistor 461 (in FIG. 4), a capacitor 565 is connected between the output terminal 519 and the ground potential 563. The output current 521 may charge the capacitor 565 and thereby an output voltage may be generated across the capacitor 565 which may be acquired at the output terminal 519.

Figure 6:
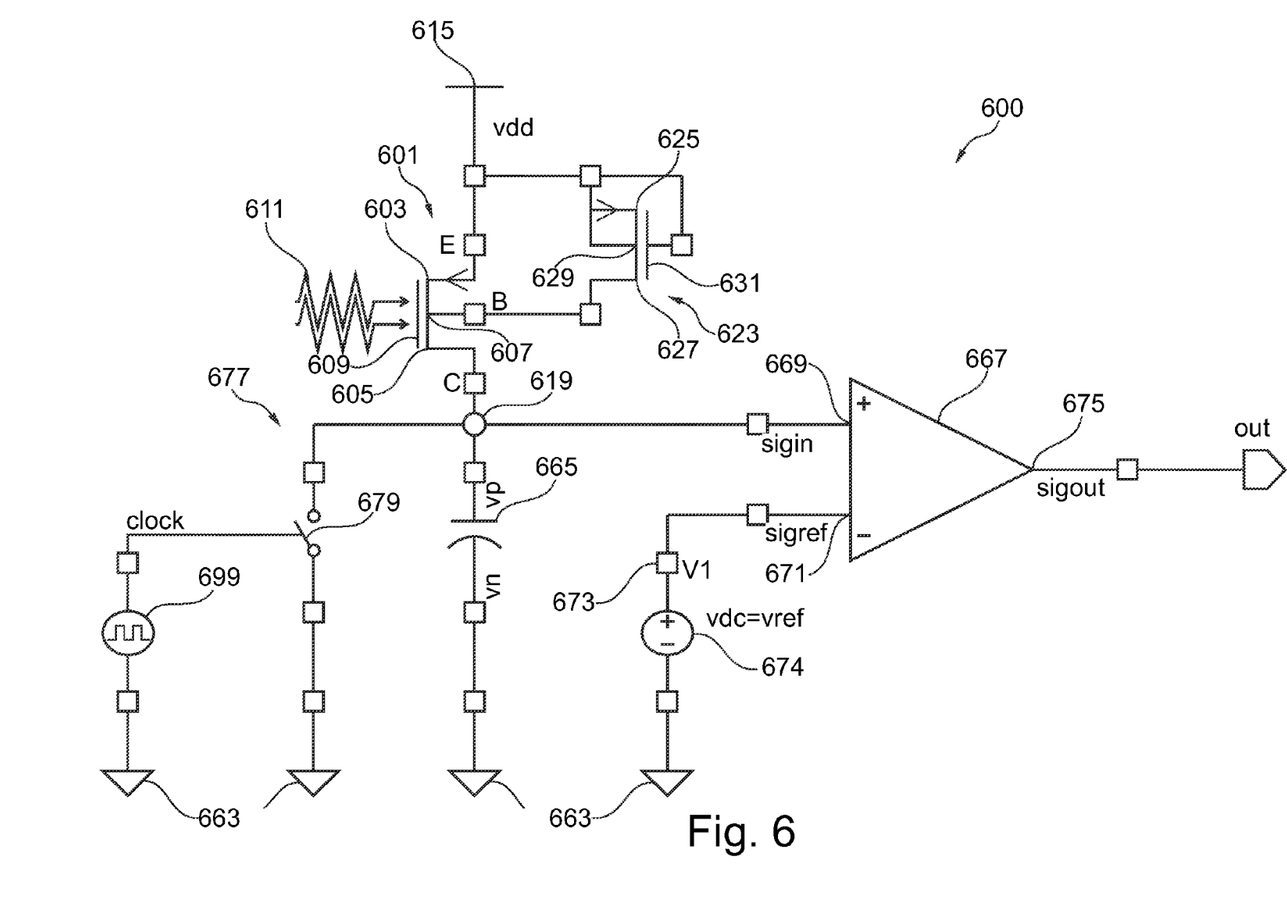
FIG. 6 illustrates an arrangement for registering light according to an embodiment of the present invention.

FIG. 6 schematically illustrates a further embodiment of an arrangement 600 for registering light according to an embodiment of the present invention. The arrangement 600 comprises the arrangement 500 illustrated in FIG. 5 and in addition a comparator 667 having a first input terminal 669 connected to the output terminal 619 and having a second input terminal 671 connected to a reference comparator potential 673 which is generated by a voltage source 674. The comparator 667 has an output terminal 675 which represents an amplified difference between the potentials at the first input terminal 669 and the second input terminal 671.

Furthermore, the arrangement 600 comprises a capacitor discharge path 677 which enables to discharge the capacitor 665 in an alternating manner in that a controllable switch 679 connects the output terminal 619 with the ground potential 663 or isolates the output terminal 619 from the ground potential using a clock signal generated by a clock generator 699. Thereby, the light intensity can be measured whenever the controllable switch 679 is opened, in which case the capacitor 665 is charged and in which case the voltage across the capacitor 675 may be compared using the comparator 667 to the reference potential 673.

Figure 7:
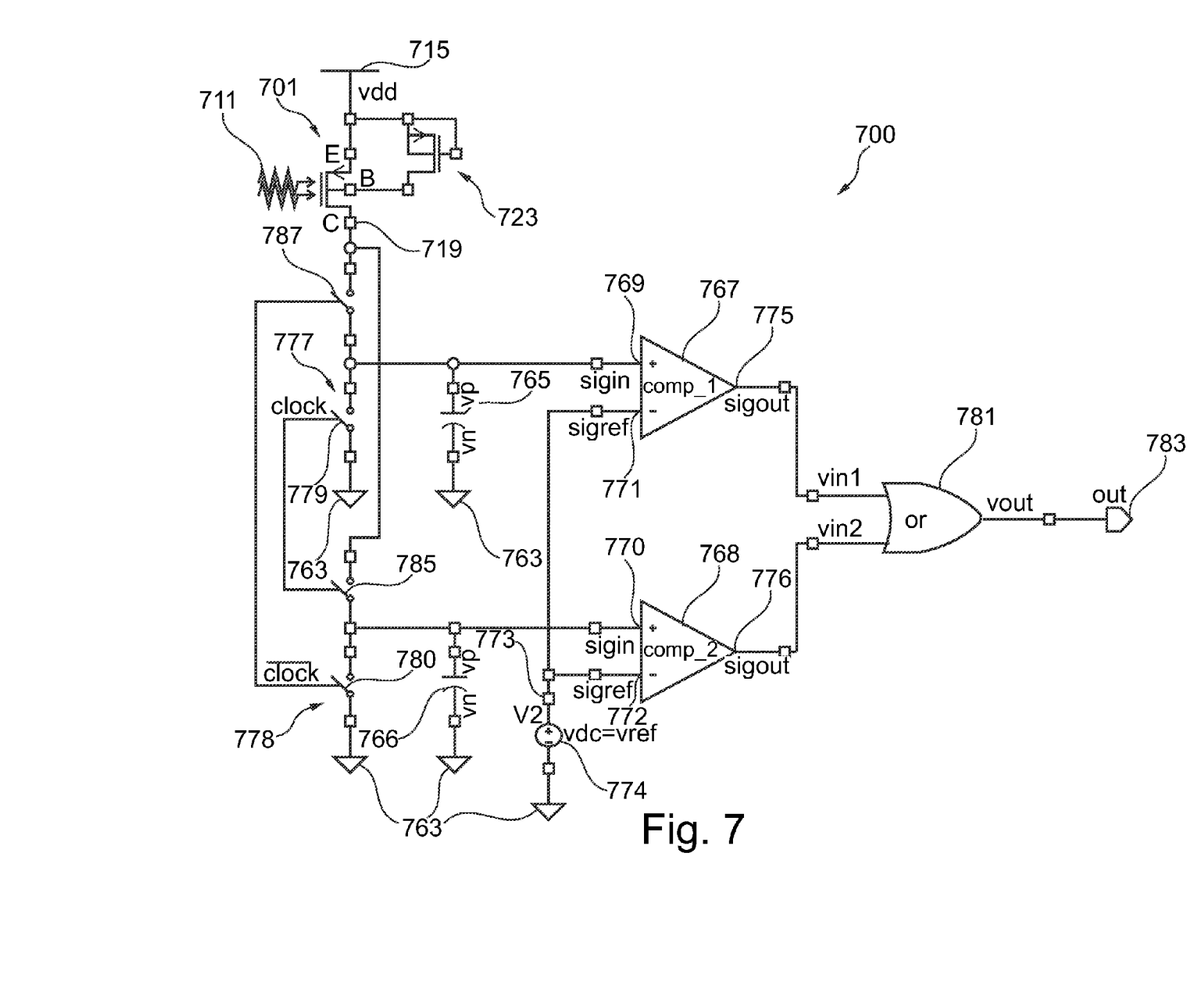
FIG. 7 illustrates an arrangement for registering light according to an embodiment of the present invention.

FIG. 7 illustrates a further arrangement 700 for registering light which enables to measure the light intensity in both phases of the clock signal, i.e. in the case when the clock signal is high and also in the case when the clock signal is low. For this purpose, the arrangement 700 comprises a further capacitor 766 which is connected (via several switches 785, 779, 787) between the output terminal 719 and the ground potential 763, a further comparator 768 having a further first input terminal 770 connected to the output terminal 719 and having a further second input terminal 772 connected to the comparator reference potential 773.

The arrangement 700 further comprises a further capacitor discharge path 778 for discharging the further capacitor 766 and a further controllable switch 780 within the further capacitor discharge path 778. Further, the arrangement 700 comprises a logical (OR-element or) NOR-element 781 which is connected to the output terminal 775 of the comparator 767 and the further comparator 768 having the output terminal 776. The NOR-element 781 provides an output at an output terminal 783 which reflects the intensity of the light 711 which is incident on the bulk region 707 of the MOS-transistor structure 701.

In particular, the controllable switch 779 (and switch 785) is switched using the clock signal (clock), while the further controllable switch 780 (and switch 787) is switched using the reverse or the inverse of the clock signal. Thereby, in the time interval, while the capacitor 765 is charged, the further capacitor 766 is discharged and vice versa. However, the two comparators 767, 768 measure in the respective time intervals when the capacitor 765 and 766, respectively, are charged, their respective voltages against the reference voltage 773 such that the light intensity is continuously measured as reflected at the output terminal 783.

The invention claimed is:

1. An arrangement for registering light, comprising:
a MOS-transistor structure having
   a first source/drain region, configured to function as a first emitter/collector region of a bipolar transistor,
   a second source/drain region, configured to function as a second emitter/collector region of a bipolar transistor, and
   a bulk region formed by a low doped well, configured to function as a base of a bipolar transistor, located at least partially between the first source/drain region and the second source/drain region, wherein the bulk region has a doping type different from another doping type of the first and the second source/drain regions, charge carriers are generated in the bulk region in dependence of light impinging on the bulk region, and the generated charge carriers control a current flowing from the first source/drain region to the second source/drain region via at least a portion of the bulk region.

2. The arrangement according to claim 1, wherein electrical charge carriers are generated, even if no voltage is applied, between the bulk region and a floating gate of the MOS-transistor structure, wherein the floating gate is separated by an isolation layer from the bulk region.

3. The arrangement according to claim 1, wherein a connection having a resistance larger than 10 MΩ is established between the bulk region and the first source/drain region.

4. The arrangement according to claim 1, further comprising:
a further MOS-transistor structure having a further first source/drain region, a further second source/drain region, a further bulk region, and a further gate, wherein the further first source/drain region, the further gate and the further bulk region are electrically connected with each other, and the further second source/drain region of the further MOS-transistor structure is electrically connected to the bulk region of the MOS-transistor structure.

5. The arrangement according to claim 4, wherein the further bulk region has the doping type and the further first and the further second source/drain regions have the other doping type.

6. The arrangement according to claim 4, wherein the MOS-transistor structure and the further MOS-transistor structure are of a same type and have essentially identical leakage current characteristics defining a dependency of the leakage current on the temperature, wherein the leakage current flows from the respective first source/drain region to the respective second source/drain region.

7. The arrangement according to claim 4, wherein the MOS-transistor structure and the further MOS-transistor structure are configured to have substantially a same temperature.

8. The arrangement according to claim 4, wherein a leakage current flowing from the first source/drain region to the second source/drain region is reduced by reducing charge carriers within the bulk region by current flow of the charge carriers from the bulk region to the further first source/drain region via the further second source/drain region.

9. The arrangement according to claim 4, further comprising:
an output terminal to which the second source/drain region is connected, wherein the output terminal is configured to provide an output current based on a intensity of the light impinging on the bulk region, and the first source/drain region and the further first source/drain region are electrically connected to a reference potential.

10. The arrangement according to claim 9, further comprising:
a resistor connected between the output terminal and a ground potential.

11. The arrangement according to claim 9, further comprising:
a capacitor connected between the output terminal and a ground potential.

12. The arrangement according to claim 11, further comprising:
a comparator having a first input terminal connected to the output terminal and a second input terminal connected to a reference comparator potential.

13. The arrangement according to claim 12, further comprising:
a capacitor discharge path connected between the output terminal and the ground potential;
a controllable switch within the capacitor discharge path, wherein the controllable switch is configured to be switched on and off by a clock signal.

14. The arrangement according to claim 13, further comprising:
a further capacitor connected between the output terminal and the ground potential;
a further comparator having a further first input terminal connected to the output terminal and a further second input terminal connected to the reference comparator potential;
a further capacitor discharge path connected between the output terminal and the ground potential;
a further controllable switch within the further capacitor discharge path, the further controllable switch is configured to be switched off and on by the clock signal; and
a logical OR-element connected to an output terminal of the comparator and a further output terminal of the further comparator, wherein the arrangement is configured to charge the capacitor via the output terminal when the further capacitor is discharged via the further capacitor discharge path, and charge the further capacitor via the output terminal when the capacitor is discharged via the capacitor discharge path.

15. The arrangement according to claim 1 embodied as a chip card.

16. The arrangement according to claim 4, wherein the further bulk region is configured to function as a floating well of a bipolar transistor.

17. The arrangement according to claim 4, further comprising:
   an output terminal to which the second source/drain region is connected, wherein the output terminal is configured to provide an output current based on a wavelength of the light impinging on the bulk region, and the first source/drain region and the further first source/drain region are electrically connected to a reference potential.

18. The arrangement according to claim 12, wherein the comparator is an operational amplifier.

* * * * *